US007531373B2

(12) United States Patent
Fan

(10) Patent No.: US 7,531,373 B2
(45) Date of Patent: May 12, 2009

(54) METHODS OF FORMING A CONDUCTIVE INTERCONNECT IN A PIXEL OF AN IMAGER AND IN OTHER INTEGRATED CIRCUITRY

(75) Inventor: Xiaofeng Fan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 11/857,962

(22) Filed: Sep. 19, 2007

(65) Prior Publication Data

US 2009/0075465 A1  Mar. 19, 2009

(51) Int. Cl.
  *H01L 21/00* (2006.01)
  *H01L 21/84* (2006.01)
  *H01L 21/336* (2006.01)
(52) U.S. Cl. .............................. 438/48; 438/30; 438/69; 438/200; 438/233; 438/299; 257/E21.006; 257/E21.617
(58) Field of Classification Search .......... 257/E21.006, 257/E21.617
  See application file for complete search history.

(56) References Cited

U.S. PATENT DOCUMENTS

| 3,971,065 | A | 7/1976 | Bayer |
| 5,891,799 | A | 4/1999 | Tsui |
| 6,140,630 | A | 10/2000 | Rhodes |
| 6,204,524 | B1 | 3/2001 | Rhodes |
| 6,307,243 | B1 | 10/2001 | Rhodes |
| 6,310,366 | B1 | 10/2001 | Rhodes et al. |
| 6,326,652 | B1 | 12/2001 | Rhodes |
| 6,333,205 | B1 | 12/2001 | Rhodes |

(Continued)

FOREIGN PATENT DOCUMENTS

DE  19955105  5/2000

(Continued)

OTHER PUBLICATIONS

U.S. Appl. No. 11/892,004, filed Aug. 17, 2007, Yin et al.

(Continued)

*Primary Examiner*—Walter L Lindsay, Jr.
*Assistant Examiner*—Mohsen Ahmadi
(74) *Attorney, Agent, or Firm*—Wells St. John P.S.

(57) ABSTRACT

A method of forming conductive interconnects includes forming a node of a circuit component on a substrate. A conductive metal line is formed at a first metal routing level that is elevationally outward of the circuit component. Insulative material is deposited above the first metal routing level over the conductive metal line and the circuit component. In a common masking step, a first opening is etched through the insulative material to the conductive metal line and a second opening is etched through the insulative material to the node of the circuit component that is received elevationally inward of the conductive metal line. Conductive material is concurrently deposited to within the first and second openings in respective conductive connection with the conductive metal line and the node of the circuit component. A first metal line at a second metal routing level that is above the first metal routing level is formed in conductive connection with the conductive material in the first opening. A second metal line at the second metal routing level is formed in conductive connection with the conductive material in the second opening.

23 Claims, 8 Drawing Sheets

U.S. PATENT DOCUMENTS

| | | |
|---|---|---|
| 6,376,868 B1 | 4/2002 | Rhodes |
| 6,639,261 B2 | 10/2003 | Rhodes |
| 6,737,748 B2 | 5/2004 | Bauch et al. |
| 6,767,811 B2 | 7/2004 | Rhodes |
| 6,783,900 B2 | 8/2004 | Venkataraman |
| 6,812,539 B1 | 11/2004 | Rhodes |
| 6,853,045 B2 | 2/2005 | Rhodes |
| 6,878,568 B1 | 4/2005 | Rhodes et al. |
| 6,972,209 B2 | 12/2005 | Agarwala et al. |
| 7,067,902 B2 | 6/2006 | Hichri et al. |
| 7,153,719 B2 * | 12/2006 | Patrick et al. ............... 438/60 |
| 7,271,025 B2 * | 9/2007 | Mouli ........................ 438/59 |
| 7,326,607 B2 * | 2/2008 | Rhodes ..................... 438/200 |
| 7,390,690 B2 * | 6/2008 | Rhodes ...................... 438/72 |
| 2004/0113278 A1 | 6/2004 | Dalton et al. |
| 2004/0125629 A1 | 7/2004 | Scheuerlein et al. |
| 2005/0161713 A1* | 7/2005 | Rhodes ...................... 257/292 |
| 2005/0231927 A1 | 10/2005 | Masuyama et al. |
| 2005/0266651 A1 | 12/2005 | Taylor et al. |
| 2006/0017829 A1 | 1/2006 | Gallagher |
| 2006/0141762 A1 | 6/2006 | Khandekar et al. |
| 2006/0255381 A1* | 11/2006 | McKee ...................... 257/292 |
| 2006/0289202 A1 | 12/2006 | Takeuchi et al. |
| 2007/0007616 A1 | 1/2007 | Ma et al. |
| 2007/0007659 A1 | 1/2007 | Narayan et al. |
| 2007/0023913 A1 | 2/2007 | Audet et al. |
| 2007/0075737 A1 | 4/2007 | Schmit et al. |
| 2008/0188029 A1* | 8/2008 | Rhodes ....................... 438/59 |

FOREIGN PATENT DOCUMENTS

| | | |
|---|---|---|
| JP | 63304655 | 12/1988 |
| JP | 1243548 | 9/1989 |
| JP | 2002289702 | 10/2002 |
| JP | 2006165054 | 6/2006 |
| KR | 100336654 | 12/2002 |
| WO | WO2004017687 | 2/2004 |

OTHER PUBLICATIONS

Blackshear, E. et al., "The Evolution of Build-Up Package Technology and Its Design Challenges", IBM Journal of Research and Development, Powers and Packaging, IBM JRD 49-4/5, reprinted Aug. 27, 2007, pp. 1-21.

Pham, A. et al., "Ultra Low Loss Millimeter Wave Multichip Module Interconnects", IEEE Transactions on Components, Packaging, and Manufacturing Technology—Part B, vol. 21, No. 3, Aug. 1998, pp. 302-308.

Tummala, R. et al., "High Density Packaging in 2010 and Beyond", 2002 Intl. Sympos. on Electronic Materials and Packaging, 2002 IEEE, pp. 30-36.

US 6,204,624, 03/2001, Rhodes (withdrawn)

* cited by examiner

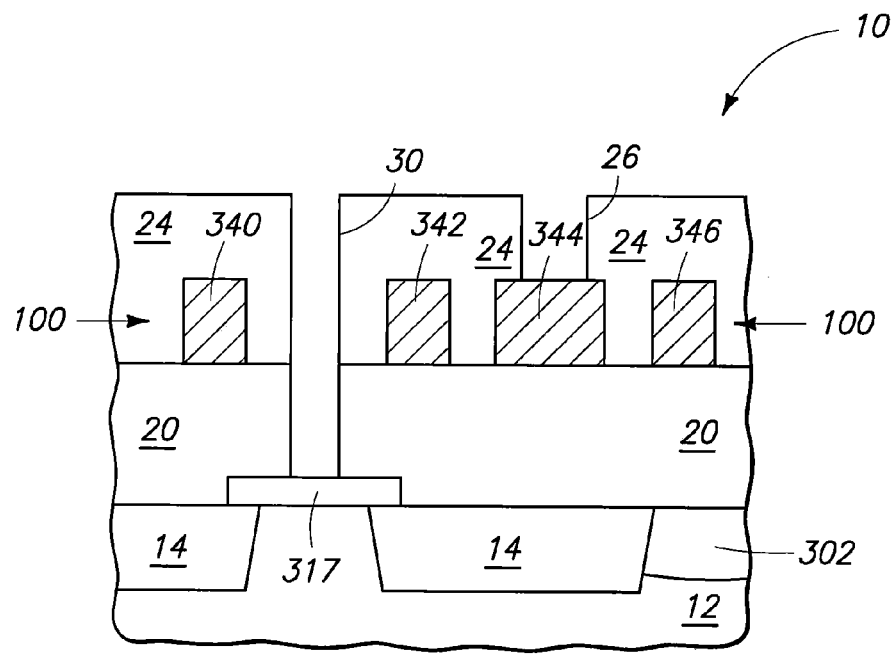
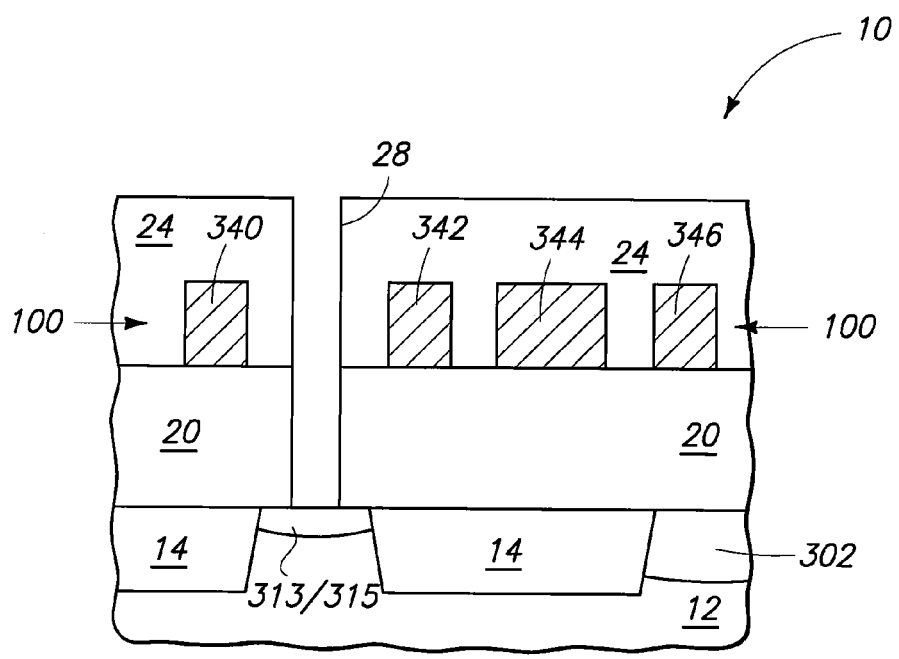

METHODS OF FORMING A CONDUCTIVE INTERCONNECT IN A PIXEL OF AN IMAGER AND IN OTHER INTEGRATED CIRCUITRY

TECHNICAL FIELD

Embodiments disclosed herein pertain to methods of forming a conductive interconnect in a pixel of an imager and in other integrated circuitry.

BACKGROUND

Solid state imaging devices, including charge coupled devices (CCD), complementary metal oxide semiconductor (CMOS) imaging devices, and others, have been used in photo imaging applications. A solid state imaging device circuit often includes a focal plane array of pixels as an image sensor, with each pixel including a photosensor which may be a photogate, a photoconductor, a photodiode, or other device having a doped semiconductive region for accumulating photo-generated charge. For CMOS imaging devices, each pixel has a charge storage region formed on or in the substrate which is connected to the gate of an output transistor that is part of a readout circuit. The charge storage region may be constructed as a floating diffusion region. In some CMOS imaging devices, each pixel may further include at least one electronic device, such as a transistor, for transferring charge from the photosensor to the storage region and one device, also typically a transistor, for resetting the storage region to a predetermined charge level. Further and regardless, in CMOS and other imaging devices, some components of a pixel might be shared with other pixels.

In a CMOS imaging device, the active elements of a pixel perform the functions of: (1) photon to charge conversion; (2) accumulation of image charge; (3) resetting the storage region to a known state; (4) transfer of charge to the storage region; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

CMOS imaging devices of the type discussed above are generally known and discussed, for example, in U.S. Pat. No. 6,140,630; U.S. Pat. No. 6,376,868; U.S. Pat. No. 6,310,366; U.S. Pat. No. 6,326,652; U.S. Pat. No. 6,204,524; and U.S. Pat. No. 6,333,205.

In order to capture images with greater resolution while also maintaining a small image sensor, it is desirable to design image sensors with a large number of relatively small pixels. As pixels become smaller, however, many of the transistors responsible for reading out the pixel signal cannot practically be made smaller, and begin to take up most of the space allocated to a single pixel. Consequently, the photosensor of the pixel becomes smaller while more of the pixel area is used by the pixel transistors such that the pixel fill factor, which is the percentage of a pixel that is photosensitive, is reduced. As photosensor size and pixel fill factor shrink, the amount of light that is converted to a signal within each pixel decreases as well.

Further, each pixel encompasses multiple metal routing layers typically formed above the photosensor and transistor gates, and which are used to convey signals, e.g., control signals, for the readout circuits between the various transistors of the pixel. As pixels are made smaller, these metal routing layers become more obstructive to light that would otherwise reach the pixel photosensor. When connecting, for example, a Metal 2 level line to a pixel component received below the Metal 1 level routing layer, an electrically isolated Metal 1 island is used as a conductive interconnect between a conductive via from Metal 2 to the island and a conductive contact from the Metal 1 island to the pixel component therebelow. The conductive Metal 1 island can require spacing of Metal 1 lines within the pixel further apart, thereby reducing the metal opening size over the photodiode of an individual pixel.

BRIEF DESCRIPTION OF THE DRAWINGS

FIGS. 3-12 illustrate method embodiments of the invention.

DETAILED DESCRIPTION OF EXAMPLE EMBODIMENTS

Example methods of forming one or more conductive interconnects in an imager pixel, or in other integrated circuitry, which comprises multilevel metal routing layers are described in connection with FIGS. 1-14. The embodiments are principally described in relation to a CMOS imaging device for convenience. However, they have wider applicability to pixels of other imaging devices and independent of the photosensor which might be used. Further, embodiments of the invention include methods of forming conductive interconnects and integrated circuitry comprising multilevel metal routing layers which are not necessarily encompassed by an imager.

Figure 1:
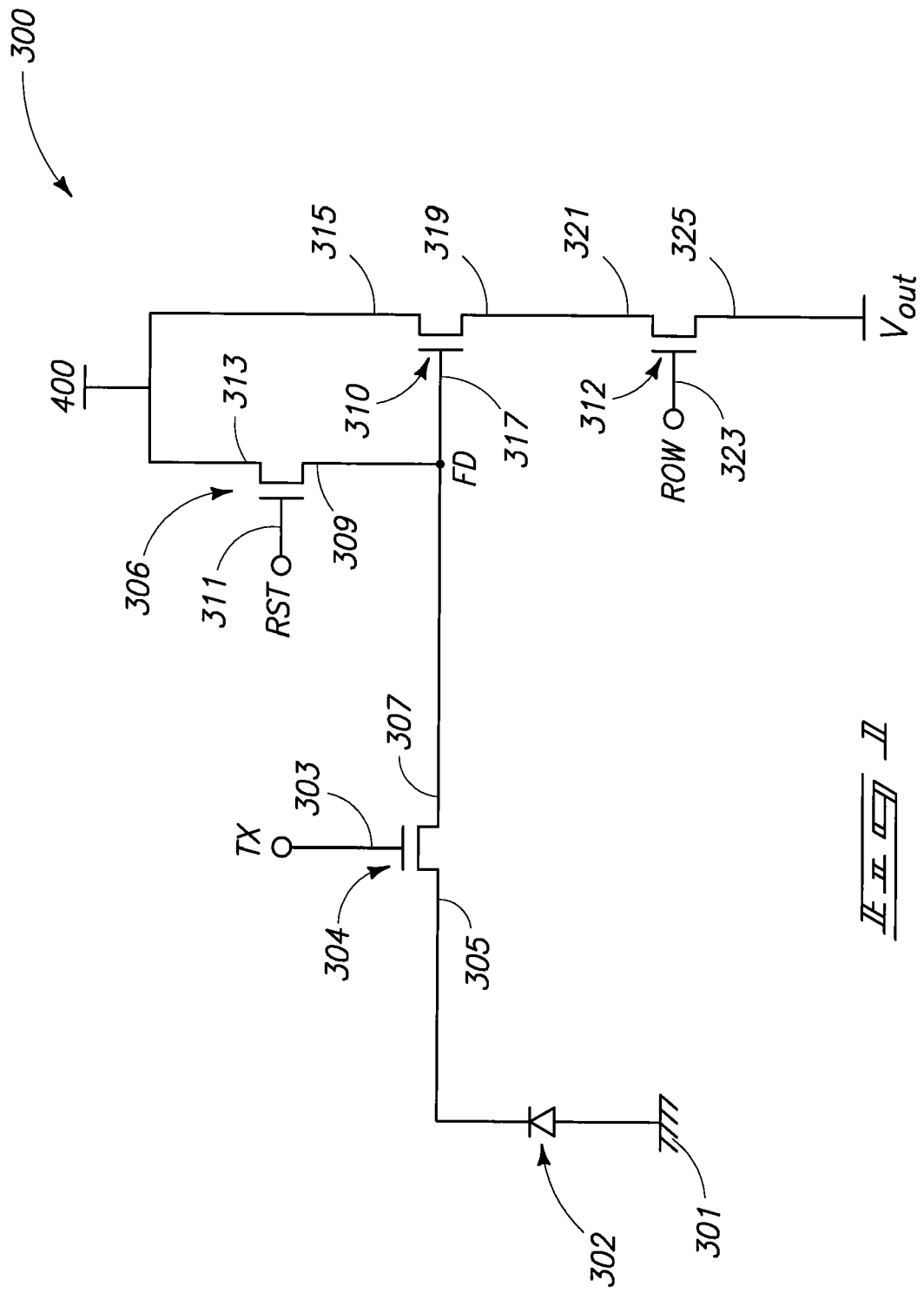
FIG. 1 is a schematic of an imager pixel, with methods of fabricating such comprising an embodiment of the invention.
Figure 2:
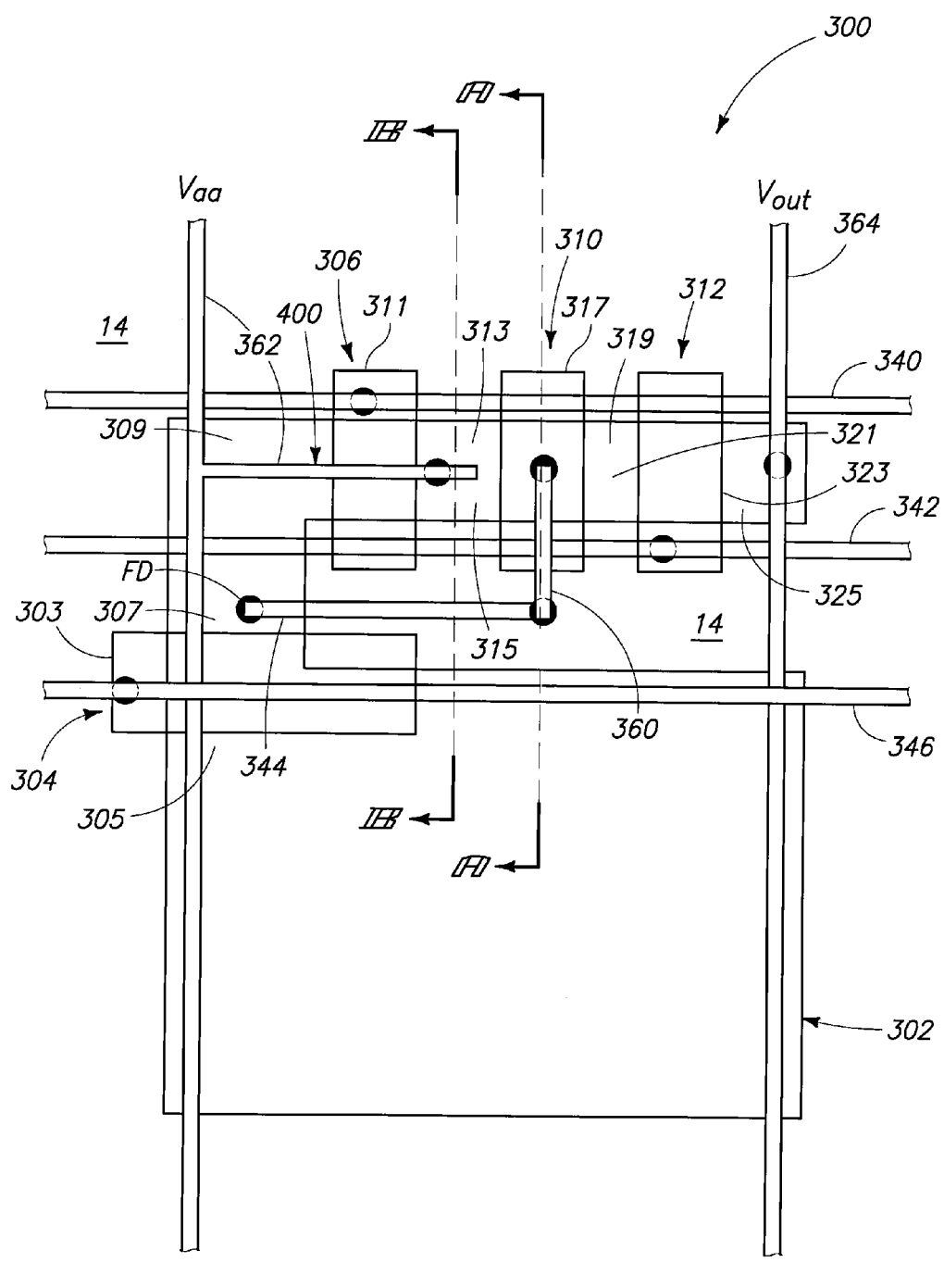
FIG. 2 is a diagrammatic top layout of an example imager pixel of the FIG. 1 schematic, with methods of fabricating such comprising an embodiment of the invention.

Referring initially to FIGS. 1 and 2, a pixel 300 of an imager, for example a CMOS imager, is depicted. FIG. 1 is but one example schematic of a single CMOS imager pixel, and FIG. 2 is but one example top layout view of a CMOS imager pixel of the FIG. 1 schematic. Other layouts and schematics of an imager pixel are also of course contemplated. Further and accordingly, multiple pixels might share components with other pixels, for example containing sets of pixels which share readout or other pixel circuitry. The term "pixel", as used herein, refers to a photo-element unit cell containing at least a photosensor for converting photons to an electrical signal, and which includes multilevel metal routing layers above the photosensor and which form a part of the pixel and may connect with or be shared by other pixels.

FIGS. 1 and 2 essentially depict a finished construction of an example CMOS image sensor pixel 300. Such includes a photosensor 302 (e.g., a photodiode, photogate, etc.) a transfer transistor 304, a floating diffusion region FD, a reset transistor 306, a source follower transistor 310, and row select transistor 312. Transfer transistor 304 comprises a gate 303, a source 305, and a drain 307. Photosensor 302 connects between ground 301 and source 305 of transfer transistor 304. Photosensor 302 is thereby connected to floating diffusion region FD by transfer transistor 304 when transfer gate 303 is activated by a transfer control signal TX.

Reset transistor 306 comprises a source 309, a gate 311, and a drain 313. Floating diffusion region FD connects with source 309 of reset transistor 306, and a voltage supply line 400 connects with reset transistor drain 313. Accordingly, reset transistor 306 is connected between floating diffusion region FD and voltage supply line 400. A reset control signal RST applied to reset transistor gate 311 can be used to activate reset transistor 306, which resets floating diffusion region FD to the voltage supply line 200 level (i.e., $V_{aa}$) as is known in the art.

Source follower transistor 310 includes a drain 315, a gate 317, and a source 319. Row select transistor 312 comprises a drain 321 which connects with source 319 of source follower transistor 310, a gate 323, and a source 325. Drain 315 of source follower transistor 310 connects with drain 313 of reset transistor 306 and voltage supply line 400. Floating diffusion region FD connects with gate 317 of source follower transistor 310. Accordingly, source follower transistor 310 is connected to floating diffusion region FD and is connected between voltage supply line 400 and row select transistor 312. Source follower transistor 310 converts the charge stored at floating diffusion region FD into an electrical output signal $V_{out}$. Row select transistor 312 is controllable by a row select signal ROW for selectively connecting source follower transistor 310 and its output voltage signal $V_{out}$ to a column line of a pixel array.

FIG. 2 depicts finished construction of the pixel. Processing in connection with FIGS. 3-12 is described below of example embodiments of methods of forming one or more conductive interconnects in imager pixel 300 which comprises multilevel metal routing layers. FIGS. 3, 5, 7, 9 and 11, by way of example only, depict processing occurring relative to section line A-A in FIG. 2. FIGS. 4, 6, 8, 10 and 12 depict processing occurring relative to section line B-B in FIG. 2.

Figure 3:
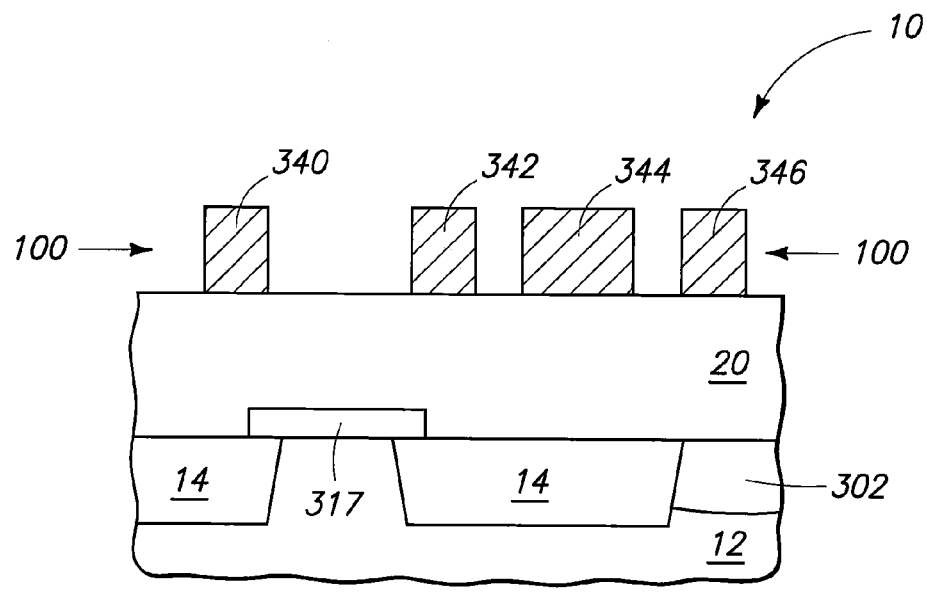
Figure 4:
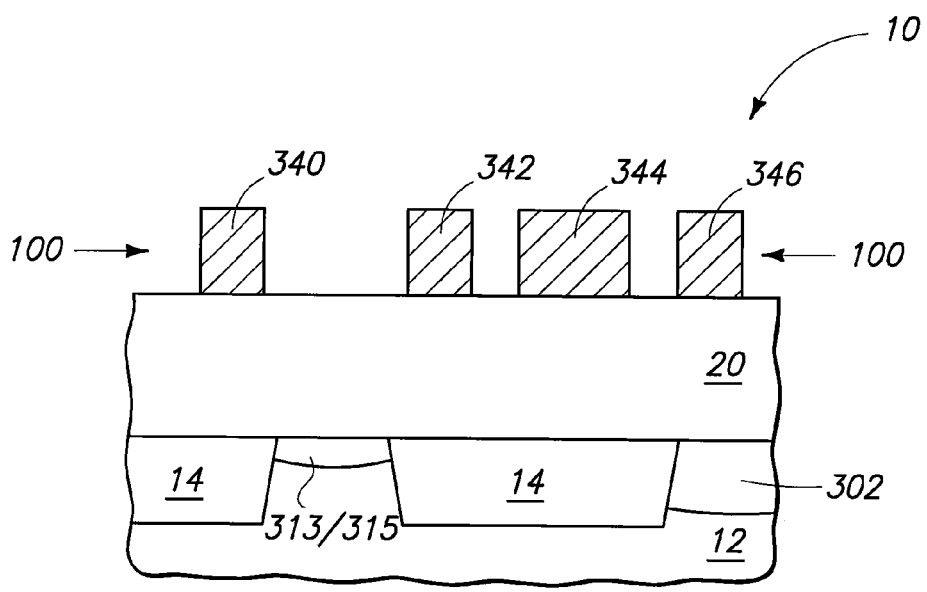

Referring initially to FIGS. 3 and 4, a substrate 10, for example a semiconductor substrate, comprises bulk semiconductive material 12 having field isolation regions 14 formed therein. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 might of course comprise a semiconductor-on-insulator or other substrate, and whether existing or yet-to-be developed.

Diffusion region 313/315 (FIG. 4) is depicted as having been formed relative to active area of substrate material 12 to comprise the drains of reset and source follower transistors 306 and 310, respectively (FIGS. 1 and 2). Source follower transistor gate 317 (FIG. 3) and a diffusion region of photosensor 302 (FIGS. 3 and 4) are also shown. An insulator material 20 is formed outwardly of materials 12 and 14. Such might be homogenous or non-homogenous. Regardless, example materials include undoped silicon dioxide, silicon dioxide doped with one or more of phosphorous and boron, and/or silicon nitride. Example insulator material 20 is depicted as comprising a substantially planar outer surface having a plurality of conductive metal lines 340, 342, 344, and 346 formed at a first metal routing level 100. In the context of this document, a "metal routing level" is a mean substrate elevation at which a plurality of conductive metal interconnect lines runs in a substantially horizontal manner. Further in the context of this document, a "metal line" or "metal interconnect line" requires at least a majority portion of such line to be fabricated of an elemental metal and/or alloy of elemental metals. First metal routing level 100 may or may not constitute the first-ever metal routing level on the substrate, which is known by people of skill in the art to constitute the Metal 1 level. In the depicted FIGS. 3 and 4 example, first metal routing level 100 is depicted as being Metal 1, although such might constitute a higher metal routing level above Metal 1.

In one embodiment, a method of forming conductive interconnects in a pixel of an imager where the pixel comprises multilevel metal routing layers includes forming a node of a circuit component of an imager pixel on a substrate. Such might constitute any node of any circuit component of any imager pixel. By way of example only and where the imager pixel is a CMOS imager, the node of the circuit component might comprise any of a ground contact of a photosensor of the imager pixel, a FD contact, a $V_{aa}$ contact, a $V_{out}$ contact, a contact to a source of a source follower transistor, or a contact to a source or a drain of an anti-blooming transistor. With respect to FIGS. 3 and 4, diffusion region 313/315 in semiconductive material 12 comprises such a node of a circuit component of imager pixel 300, for example with one or both of reset transistor 306 or source follower transistor 310 being example circuit components of imager pixel 300. Alternately, and by way of example only, the node of the circuit component might comprise a gate of a field effect transistor of the imager pixel that is below a Metal 1 level.

A conductive metal line is formed at a first metal routing level that is elevationally outward of the circuit component of the imager pixel. In FIGS. 3 and 4, conductive metal line 344 at first metal routing level 100 is an example such line for purposes of the continuing discussion. In this particular example, conductive metal line 344 comprises a metal interconnect line which will connect floating diffusion region FD with gate 317 of source follower transistor 310, and as described below. Alternate conductive metal lines in an imager pixel, such as a CMOS imager, are also of course contemplated. For example and by way of example only, the conductive metal line in this described embodiment might comprise any of a line to a ground contact of a photosensor of the imager pixel, a line to a $V_{aa}$ contact, a line to a $V_{out}$ contact, a line to a contact of a source of a source follower transistor, a line to a gate of a reset transistor, a line to a gate of a row select transistor, a line to a gate of a transfer transistor, a voltage supply line, a line to a source or a drain contact of an anti-blooming transistor, or a line to a gate of an anti-blooming transistor.

Figure 5:
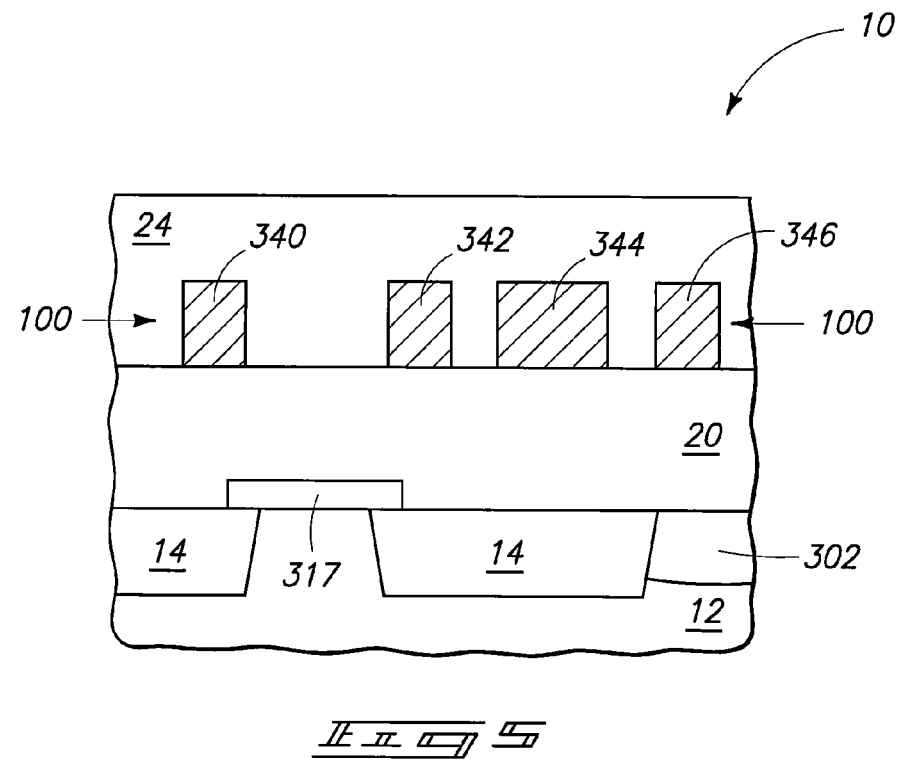
Figure 6:
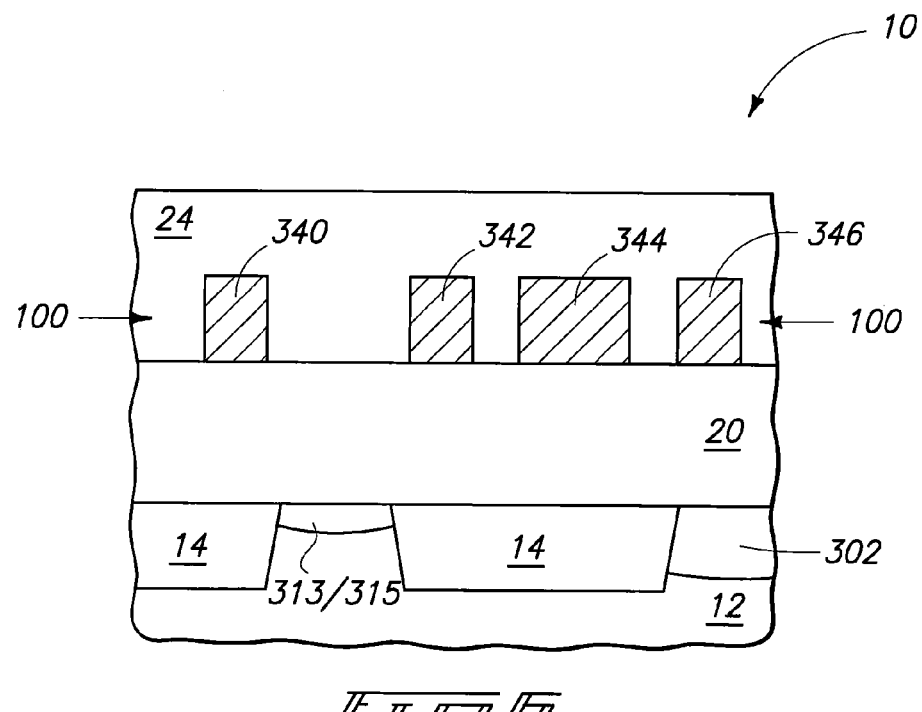

Referring to FIGS. 5 and 6, insulative material 24 has been deposited above first metal routing level 100 over the depicted conductive metal lines and over the circuit components of the imager pixel elevationally inward thereof. Insulative material 24 might be homogenous or non-homogenous, and regardless comprise any one or more of the materials of insulator material 20.

Referring to FIGS. 7 and 8, and in a single or in at least one common masking step (meaning in at least one shared masking step wherein outlines of both the first and second openings are being defined), a first opening 26 has been etched through insulative material 24 to conductive metal line 344, and a second opening 28 has been etched through insulative material 24 to node 313/315 of the circuit component of imager pixel 300 that is received elevationally inward of conductive metal line 344. Further and accordingly in the depicted example, second opening 28 is etched to a node 313/315 which also comprises a $V_{aa}$ node. FIGS. 7 and 8 also depict, using the single or at least one common masking step to etch a third opening 30 through insulative material 24 to a gate of a field effect transistor of the imager pixel, namely to gate 317 of source follower transistor 310.

By way of example only, a single masking, or at least one masking step common to the fabrication of depicted openings 26, 28 and 30, might comprise using photolithographic patterning and etch. For example, a photoresist layer could be deposited over insulative material 24 and patterned to have openings largely corresponding to what will be the outlines of openings 26, 28, and 30. Other openings would likely also be provided in such a mask step elsewhere within pixel 300, and most likely elsewhere on the substrate. Regardless, such a photoresist layer can be utilized as an etching mask for etching openings 26, 28, and 30.

Figure 9:
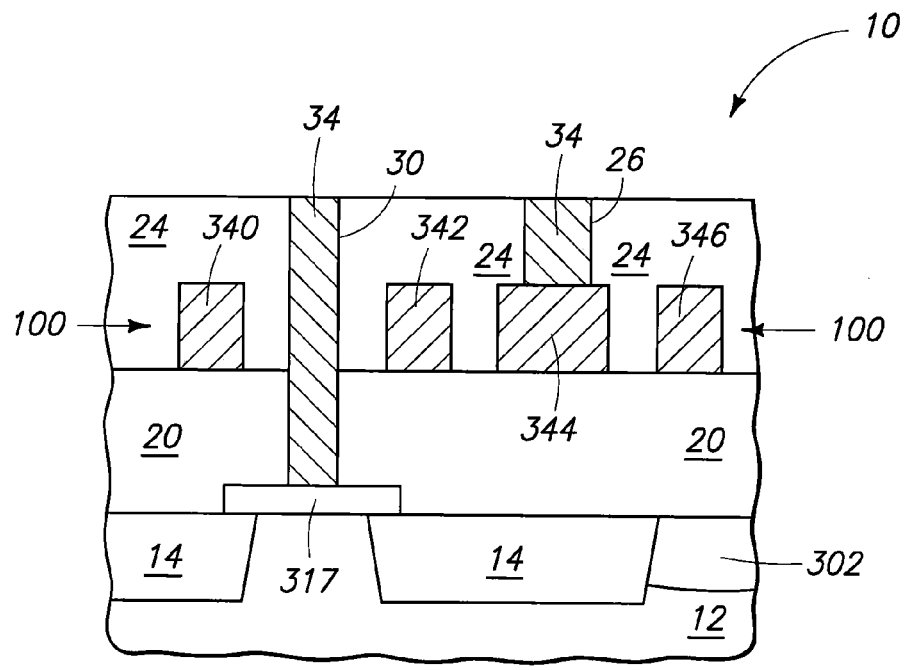
Figure 10:
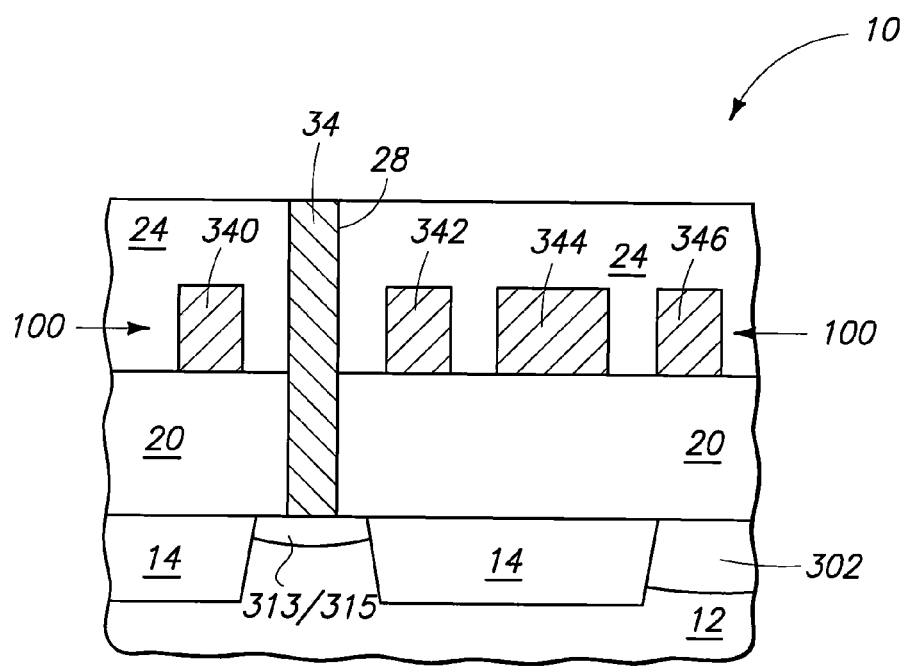

Referring to FIGS. 9 and 10, conductive material 34 has been concurrently deposited within at least first and second openings 26 and 28, respectively, with such depositing in the depicted example also being to within third opening 30. Conductive material 34 might be homogenous or non-homogenous, and might comprise multiple separate layer and material depositions.

In one embodiment, material 34 comprises or consists of metal. Regardless, FIGS. 9 and 10 depict conductive material 34 within first opening 26 being in conductive connection with conductive metal line 344, conductive material 34 within second opening 28 being in conductive connection with node 313/315, and conductive material 34 within third opening 30 being in conductive connection with gate 317. In one embodiment and as shown, conductive material 34 is formed to be in direct physical touching contact with the respective of such nodes to which such conductively connects. The constructions of FIGS. 9 and 10 might be fabricated by depositing one or more conductive materials 34 to overfill the depicted openings 26, 28, and 30, followed by polishing of conductive material 34 inwardly at least to the outer surface of insulative material 24. Any alternate processing is of course contemplated, with one example being described below.

Figure 11:
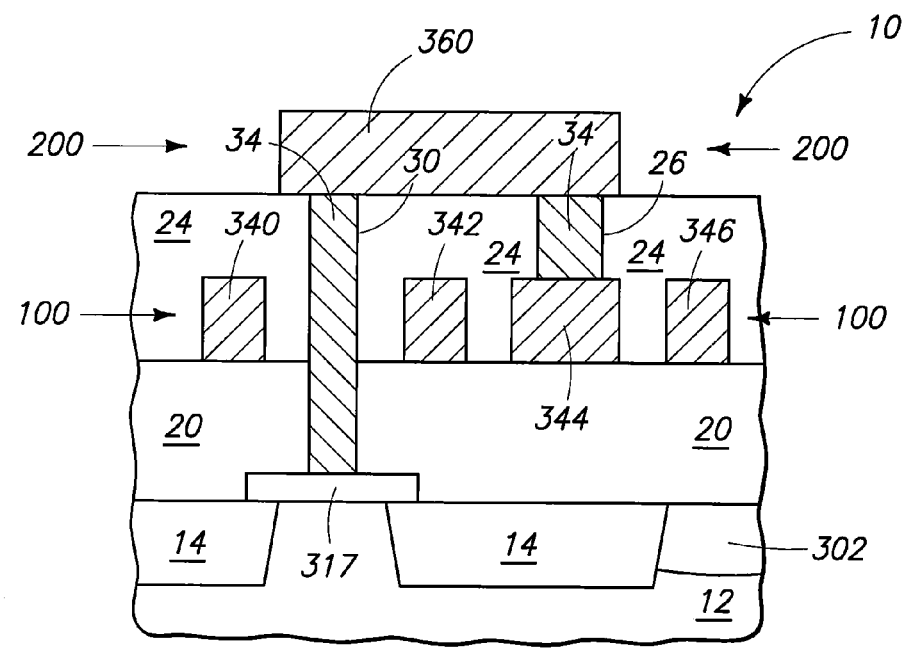
Figure 12:
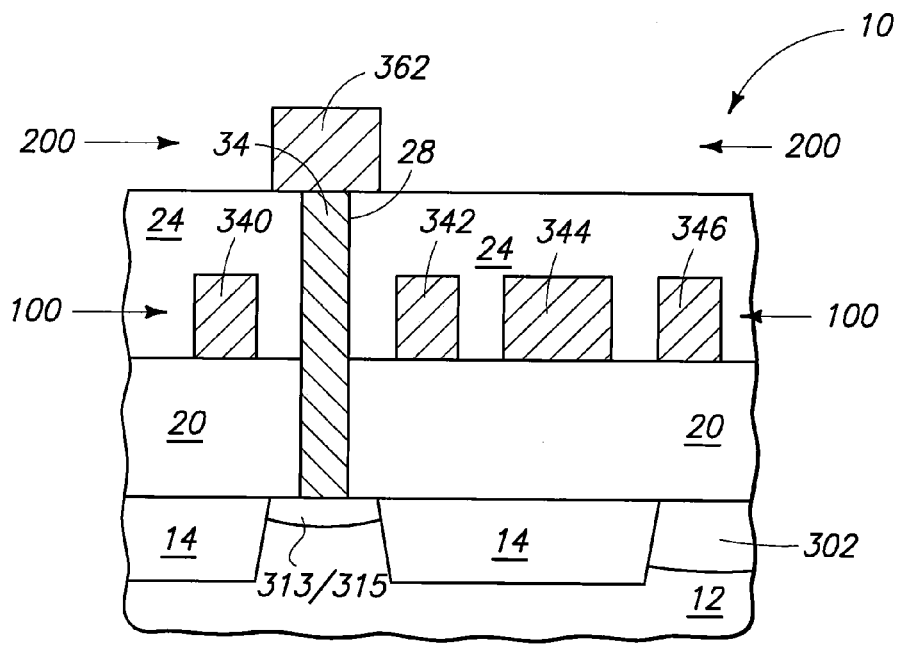

Referring to FIGS. 11 and 12, a first metal line 360 has been formed at a second metal routing level 200 that is above first metal routing level 100, and in conductive connection with conductive material 34 in first opening 26. Also, a second metal line 362 has been formed at second metal routing level 200 in conductive connection with conductive material 34 within second opening 28. Further in the depicted example, first metal line 360 has also been formed in conductive connection with conductive material 34 in third opening 30. Commensurate with such processing, a $V_{out}$ line 364 (FIG. 2) may also be fabricated in conductive connection with node/source 325 of row select transistor 312. Other metal lines would likely also of course be fabricated over substrate 10 at metal routing level 200. In one embodiment, metal routing level 200 is the Metal 2 level, although such might be a higher metal routing level and not necessarily the next adjacent metal routing level to that of metal routing level 100.

The metal of lines 360 and 362 might be of the same or different composition(s) as that of conductive material 34. Such might be formed, by way of example only, by deposition of one or more metal layers over insulative material 24 and subtractive etching thereof using photomasking. Alternately and by way of example only, the concurrently depositing of conductive material 34 to within the depicted openings could be conducted to effectively over-fill such openings sufficiently such that the example first and second metal lines 360, 362 are formed by substractively etching a portion of the conductive material 34 which is received elevationally outward of the openings 26, 28, and 30 to produce the example FIGS. 11 and 12 construction. In one implementation, first metal routing level 100 is Metal 1, and second metal routing level 200 is Metal 2.

In one embodiment, a method of forming a conductive interconnect in an imager pixel that comprises multilevel metal routing layers includes forming a node of a circuit component of an imager pixel on a substrate. The node comprises at least one of a diffusion region and semiconductive material of the substrate or a gate of a field effect transistor of the imager pixel. By way of example only, any of the above nodes, circuit components and gates might be utilized. By way of example only, gate 317 in FIG. 3 and diffusion region 313/315 in FIG. 4 are example such nodes.

A conductive metal line is formed at a Metal 1 level that is elevationally outward of the circuit component of the imager pixel which is received inwardly of the Metal 1 level. Any of lines 340, 342, 344, or 346 are an example such conductive line. An insulative material is deposited over the Metal 1 level line and over the circuit component of the imager pixel. Insulative material 24, by way of example only, in FIGS. 4 and 5 is one example.

An opening is etched through the insulative material past the Metal 1 level to the node of the circuit component of the imager pixel that is received elevationally inward of the Metal 1 level. Each of openings 28 and 30 in FIGS. 7 and 8 are an example of such an opening which has been so etched, and regardless of whether both are etched, regardless of whether opening 26 is etched, and regardless of whether any other opening is etched within an insulative material 24.

Conductive material is deposited to within the opening in conductive connection with the node of the circuit component of the imager pixel. Conductive material 34 deposited within either of openings 28 and/or 30 in FIGS. 9 and 10 is such an example depositing.

A conductive metal line is formed at a metal routing level that is higher than Metal 1 and in conductive connection with the conductive material in the opening. Either of conductive metal lines 360 or 362 in FIGS. 11 and 12 are an example of such a conductive metal line. Other attributes as described above might also additionally be utilized and are contemplated. Further of course, the conductive metal routing level higher than Metal 1 might be Metal 2 or might be higher than Metal 2.

Figure 13:
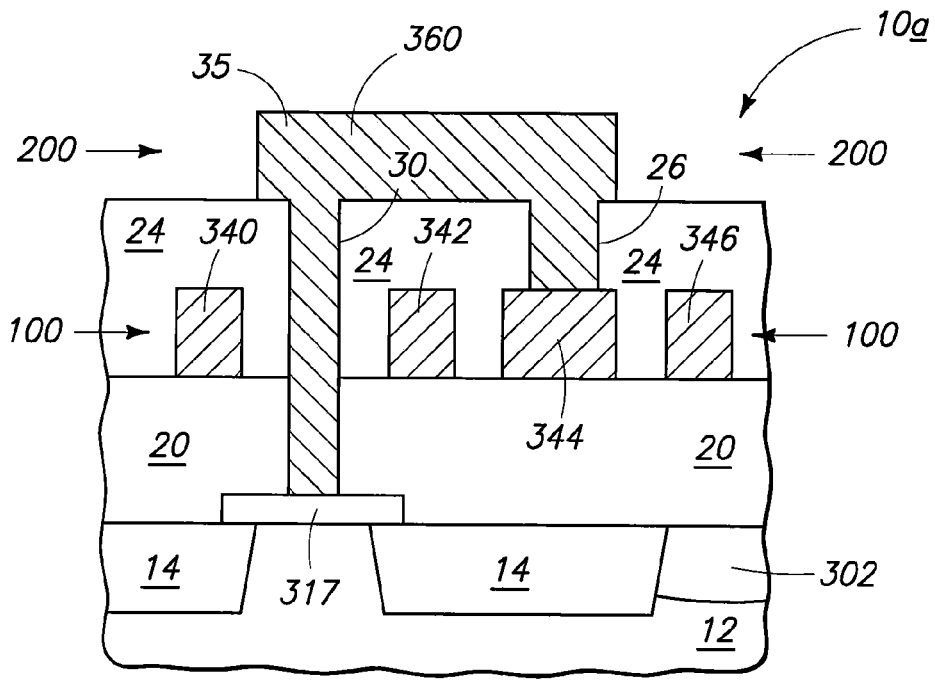
FIGS. 13 and 14 illustrate additional method embodiments of the invention.
Figure 14:
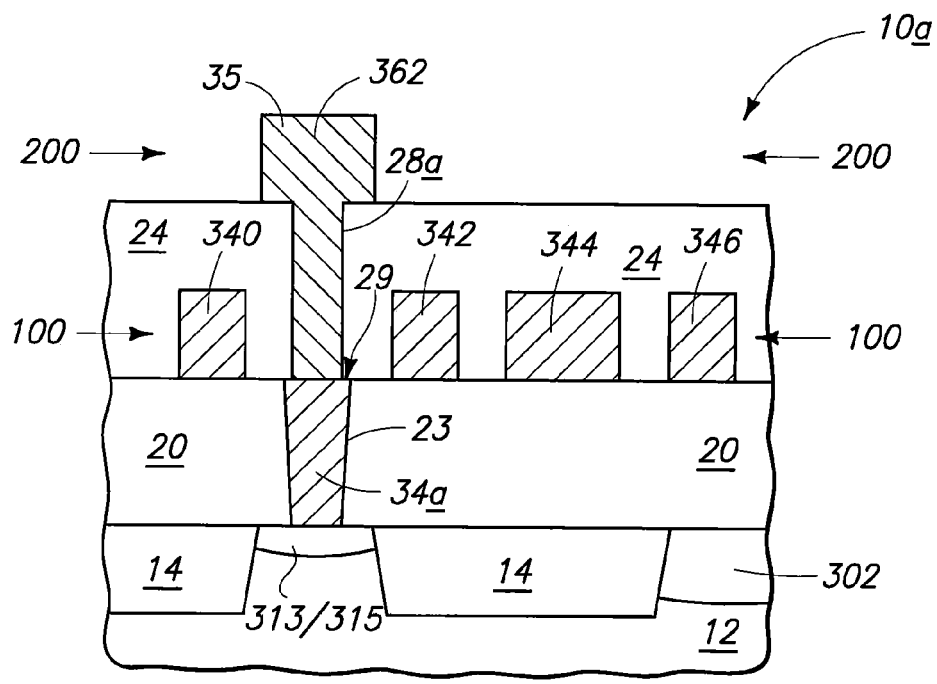

The above example FIG. 12 processing embodiment depicts the node of the circuit component comprising a diffusion region, for example region 313/315 in a semiconductive material, for example material 12, and with conductive material 34 deposited therewithin being in direct physical touching contact with diffusion region 313/315. FIGS. 13 and 14 depict an alternate embodiment 10a positionally corresponding to FIGS. 11 and 12, respectively. Like numerals from the first described embodiment have been utilized where appropriate, with differences being indicated with the suffix "a" or with different numerals.

Referring to FIG. 14, and perhaps prior to forming conductive metal lines 340, 342, 344, and 346, an opening 23 has been formed within insulator layer 20 to diffusion region 313/315. Such has been subsequently filled with a conductive material 34a. Subsequent processing is depicted as occurring whereby an opening 28a has been formed in a single or at least one common masking step to the formation of openings 30 and 26. Opening 28a extends to an outer surface 29 of conductive material 34a within opening 23 of insulator material 20.

Conductive material 35 is depicted as having been concurrently deposited to overfill openings 26, 30, and 28a, and then subjected to patterning and subtractive etch to form the depicted lines 360 and 362. Alternately and by way of example only, conductive material 35 might be deposited to overfill openings 26, 30, and 28a, and then polished back at least to the outer surface of insulative material 24. Thereafter, conductive material could be deposited and patterned and subtractively etched to form lines 360 and 362. Regardless, conductive material 35 might be the same or different composition(s) as materials 34 or 34a.

The depositing of conductive material 35 at least to within the example first opening 26 and example second opening 28a is in respective conductive connection with conductive metal line 344 and with node 313/315, respectively. Additionally or alternately, the node of the circuit component to which conductive material 35 within opening 28a connects may be considered as being to that of an outer surface 29 of a conductive pillar formed by material 34a within opening 23 that extends outwardly from a diffusion region 313/315. In such example, node 29 is still received elevationally inward of metal routing level 100, and in the depicted example conductive material 35 is in direct physical touching contact with outer surface 29.

Without being limited by any theory of invention and without requiring that any embodiment of the invention necessarily achieve any advantage, one or more advantages might result or be enabled. For example, it is conventional to refer to a "contact" as any electrical connection through an insulator that connects from M1 to the bulk semiconductive material or to the first level transistor gates. It is also conventional to refer to a "via" as any electrical connection through an insulator between any two or more different metal layers (i.e, any of M1, M2, M3, etc.). Such contacts and vias in imagers in the prior art are understood to be one or both of etched separately or require surrounding metal pads underneath and above the vias. Mixed via and contact etching in a process of forming an imager pixel in an embodiment of the invention may be used, and may enable eliminating of surrounding metal pads for stacked via and contact structures.

Although the above described embodiments were in connection with forming one or more conductive interconnects in a pixel of an imager, embodiments herein also include methods of forming conductive interconnects in integrated circuitry comprising multilevel metal routing layers regardless of whether within a pixel and regardless of whether formed as part of any imager device or imager circuitry. For example in one embodiment, such a method comprises forming a node of a circuit component on a substrate. A conductive metal line is formed at a first metal routing level that is elevationally outward of the circuit component. Insulative material is deposited above the first metal routing level over the conductive metal line and the circuit component. Example processing as described above, and regardless of whether in the context of a pixel or in the context of an imager, could of course be utilized.

In a single or at least one common masking step, a first opening is etched through the insulative material to the conductive metal line and a second opening is etched through the insulative material to the node of the circuit component that is received elevationally inward of the conductive metal line. Conductive material is concurrently deposited to within the first and second openings in respective conductive connection with the conductive metal line and the node of the circuit component. A first metal line is formed at a second metal routing level that is above the first metal routing level in conductive connection with the conductive material in the first opening. A second metal line is formed at the second metal routing level in conductive connection with the conductive material in the second opening. Any of the above described processing attributes, materials, and constructions can of course be utilized.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming conductive interconnects in an imager pixel comprising multilevel metal routing layers, comprising:
    forming a node of a circuit component of an imager pixel on a substrate;
    forming a conductive metal line at a first metal routing level that is elevationally outward of the circuit component of the imager pixel;
    depositing insulative material above the first metal routing level over the conductive metal line and over the circuit component of the imager pixel;
    in a common masking step, etching a first opening through the insulative material to the conductive metal line and etching a second opening through the insulative material to the node of the circuit component of the imager pixel that is received elevationally inward of the conductive metal line;
    concurrently depositing conductive material to within the first and second openings in respective conductive connection with the conductive metal line and with the node of the circuit component of the imager pixel; and
    forming a first metal line at a second metal routing level that is above the first metal routing level in conductive connection with the conductive material in the first opening and forming a second metal line at the second metal routing level in conductive connection with the conductive material in the second opening.

2. The method of claim 1 wherein the imager pixel is of a CMOS imager, the node of the circuit component comprising any of a ground contact of a photosensor of the imager pixel, a FD contact, a $V_{aa}$ contact, a $V_{out}$ contact, a contact to a source of a source follower transistor, or a contact to a source or drain of an anti-blooming transistor.

3. The method of claim 2 wherein the node of the circuit component comprises a diffusion region in a semiconductive material.

4. The method of claim 3 wherein the node comprises an outer surface of a conductive pillar extending outwardly from the diffusion region, the conductive material deposited to within the second opening being in direct physical touching contact with the outer surface.

5. The method of claim 3 wherein the conductive material deposited to within the second opening is in direct physical touching contact with the diffusion region.

6. The method of claim 1 wherein the imager pixel is of a CMOS imager, the conductive metal line comprising any of a line to a ground contact of a photosensor of the imager pixel, a line to a FD contact, a line to a $V_{aa}$ contact, a line to a $V_{out}$ contact, a line to a contact of a source of a source follower transistor, a line to a gate of a reset transistor, a line to a gate of a row select transistor, a line to a gate of a transfer transistor, a voltage supply line, a line to a source or a drain contact of an anti-blooming transistor, or a line to a gate of an anti-blooming transistor.

7. The method of claim 1 wherein the node of the circuit component comprises a gate of a field effect transistor of the imager pixel that is below a Metal 1 level.

8. The method of claim 7 wherein the node comprises an outer surface of a conductive pillar extending outwardly from the gate, the conductive material deposited to within the second opening being in direct physical touching contact with the outer surface.

9. The method of claim 1 wherein the first metal routing level is Metal 1, and the conductive metal line is a Metal 1 level line.

10. The method of claim 9 wherein the second metal routing level is Metal 2, and the first and second metal lines are different Metal 2 level lines.

11. The method of claim 10 wherein the node of the circuit component comprises a diffusion region in a semiconductive material, the conductive material deposited to within the second opening being in direct physical touching contact with the diffusion region.

12. The method of claim 1 comprising polishing the conductive material prior to forming the first and second metal lines.

13. The method of claim 1 wherein the concurrently depositing of the conductive material over-fills the first and second openings, the first and second metal lines comprising the conductive material, the forming of the first and second metal lines comprising subtractively etching of a portion of the conductive material received elevationally outward of the first and second openings.

14. A method of forming conductive interconnects in an imager pixel comprising multilevel metal routing layers, comprising:
  forming a gate of a field effect transistor of an imager pixel over a substrate and forming a substrate diffusion region of the imager pixel;
  forming a conductive metal line at a Metal 1 level that is elevationally outward of the gate and substrate diffusion region of the imager pixel;
  depositing insulative material over the Metal 1 level line and over the gate and substrate diffusion region of the imager pixel;
  in a common masking step, etching a first opening through the insulative material to the Metal 1 level line, etching a second opening through the insulative material past the Metal 1 level to the substrate diffusion region of the imager pixel, and etching a third opening through the insulative material past the Metal 1 level to the gate of the imager pixel;
  concurrently depositing conductive material to within the first, second, and third openings in respective conductive connection with the Metal 1 level line, with the substrate diffusion region of the imager pixel, and with the gate of the imager pixel; and
  forming a first conductive metal line at a Metal 2 level in conductive connection with the conductive material in the first and third openings, and forming a second conductive metal line at the Metal 2 level in conductive connection with the conductive material in the second opening.

15. The method of claim 14 wherein the imager pixel is of a CMOS imager, the Metal 1 level line comprising a line to a floating diffusion contact.

16. The method of claim 14 wherein the imager pixel is of a CMOS imager, the gate being that of a source follower transistor.

17. The method of claim 14 wherein the imager pixel is of a CMOS imager, the substrate diffusion region comprising a $V_{aa}$ node.

18. A method of forming a conductive interconnect in an imager pixel comprising multilevel metal routing layers, comprising:
  forming a node of a circuit component of an imager pixel on a substrate, the node comprising at least one of a diffusion region in semiconductive material of the substrate or a gate of a field effect transistor of the imager pixel;
  forming a conductive metal line at a Metal 1 level that is elevationally outward of the circuit component of the imager pixel;
  depositing insulative material over the Metal 1 level line and over the circuit component of the imager pixel;
  etching an opening through the insulative material past the Metal 1 level to the node of the circuit component of the imager pixel that is received elevationally inward of the Metal 1 level;
  depositing conductive material to within the opening in conductive connection with the node of the circuit component of the imager pixel; and
  forming a conductive metal line at a conductive metal routing level higher than the Metal 1 level in conductive connection with the conductive material in the opening.

19. The method of claim 18 wherein the node comprises said diffusion region in semiconductive material of the substrate.

20. The method of claim 19 wherein the imager pixel is of a CMOS imager, the node of the circuit component comprising any of a ground contact of a photosensor of the CMOS imager pixel, a FD contact, a $V_{aa}$ contact, a $V_{out}$ contact, a contact to a source of a source follower transistor, or a contact to a source or drain of a anti-blooming transistor.

21. The method of claim 18 wherein the node comprises said gate of said field effect transistor of the imager pixel.

22. The method of claim 18 wherein the conductive metal routing level higher than Metal 1 is Metal 2.

23. The method of claim 18 wherein the conductive metal routing level higher than Metal 1 is higher than Metal 2.

* * * * *